US010509068B2

(12) United States Patent
Takeuchi et al.

(10) Patent No.: US 10,509,068 B2
(45) Date of Patent: Dec. 17, 2019

(54) TEST DEVICE FOR A PHOTOVOLTAIC SYSTEM HAVING SOLAR CELL STRING

(71) Applicant: OMRON Corporation, Kyoto (JP)

(72) Inventors: Tsuyoshi Takeuchi, Aso (JP); Shuichi Misumi, Kyoto (JP); Akihiko Sano, Uji (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/735,958

(22) PCT Filed: Feb. 3, 2016

(86) PCT No.: PCT/JP2016/053184
§ 371 (c)(1),
(2) Date: Dec. 13, 2017

(87) PCT Pub. No.: WO2017/047111
PCT Pub. Date: Mar. 23, 2017

(65) Prior Publication Data
US 2018/0172751 A1  Jun. 21, 2018

(30) Foreign Application Priority Data
Sep. 14, 2015 (JP) ................................ 2015-180555

(51) Int. Cl.
*G01R 31/04* (2006.01)
*H01L 31/0443* (2014.01)
*H02S 50/10* (2014.01)

(52) U.S. Cl.
CPC .......... *G01R 31/04* (2013.01); *H01L 31/0443* (2014.12); *H02S 50/10* (2014.12)

(58) Field of Classification Search
CPC ... G01R 31/04; G01R 31/026; H01L 31/0443; H02S 50/10; H02S 50/00
(Continued)

(56) References Cited

U.S. PATENT DOCUMENTS

2011/0032099 A1  2/2011  Giesler
2012/0049879 A1  3/2012  Crites
(Continued)

FOREIGN PATENT DOCUMENTS

JP  2012-238716  12/2012
JP  2013-157458  8/2013
(Continued)

OTHER PUBLICATIONS

"Office Action of Japan Counterpart Application," dated Nov. 27, 2018, with English translation thereof, p. 1-p. 4.
(Continued)

*Primary Examiner* — Farhana A Hoque
(74) *Attorney, Agent, or Firm* — JCIPRNET

(57) ABSTRACT

A bypass diode with a disconnection fault is identified. A test device includes: a signal introduction circuit that applies a disconnection position identification signal to between a positive electrode and a negative electrode of a solar battery string; and a fault calculating part that identifies the bypass diode with a disconnection fault on the basis of an AC component of a voltage between a frame ground and the positive electrode or an AC component of a voltage between the frame ground and the negative electrode when the disconnection position identification signal is applied.

17 Claims, 11 Drawing Sheets

(58) Field of Classification Search
USPC .......................................... 324/523, 761.01
See application file for complete search history.

(56) References Cited

U.S. PATENT DOCUMENTS

2013/0009662 A1* 1/2013 Komano ................ H02S 50/10
324/761.01
2014/0360553 A1* 12/2014 Yoshidomi ........ H01L 31/02021
136/244

FOREIGN PATENT DOCUMENTS

| JP | 2014-011427 | 1/2014 |
| JP | 2014-011428 | 1/2014 |
| JP | 2014-033184 | 2/2014 |

OTHER PUBLICATIONS

"International Search Report (Form PCT/ISA/210) of PCT/JP2016/053184", dated Apr. 19, 2016, with English translation thereof, pp. 1-4.
"Written Opinion (Form PCT/ISA/237)", dated Apr. 19, 2016, with English translation thereof, pp. 1-6.
"Search Report of Europe Counterpart Application", dated Feb. 14, 2019, p. 1-p. 6.

\* cited by examiner

TEST DEVICE FOR A PHOTOVOLTAIC SYSTEM HAVING SOLAR CELL STRING

CROSS-REFERENCE TO RELATED APPLICATION

This application is a 371 of international application of PCT application serial no. PCT/JP2016/053184, filed on Feb. 3, 2016, which claims the priority benefit of Japan Patent Application No. 2015-180555, filed on Sep. 14, 2015. The entirety of each of the above-mentioned patent applications is hereby incorporated by reference herein and made a part of this specification.

TECHNICAL FIELD

The invention relates to a test device that tests whether there is a malfunction of a photovoltaic system including a solar cell string.

BACKGROUND ART

A photovoltaic system includes a solar cell string in which a plurality of solar cell modules are connected in series. Each solar cell module includes a plurality of solar cells which are connected in series, and a bypass diode that bypasses a current path of the solar cells is connected in parallel to each solar cell module.

The bypass diode of the solar cell module may be subject to a disconnection fault, and Patent Literatures 1 to 3 disclose techniques of detecting that a bypass diode has a disconnection fault.

Specifically, in the configuration described in Patent Literature 1, a current with a prescribed current value flows from a negative electrode of a solar cell string to a positive electrode thereof, a potential difference between the negative electrode and the positive electrode of the solar cell string is measured, and whether a bypass diode has malfunctioned is determined on the basis of the measured potential difference.

In the configuration described in Patent Literature 2, a reverse voltage with a prescribed value based on a negative electrode of a solar cell string is applied to a positive electrode thereof, a current value of a current flowing from the negative electrode of the solar cell string to the positive electrode is measured, and whether a bypass diode malfunctions is determined on the basis of the measured current value.

In the configuration described in Patent Literature 3, an AC power supply is controlled such that a bypass diode is biased forward in a solar cell panel body, and whether the bypass diode has a disconnection fault is determined on the basis of an input voltage or an input current and an output voltage or an output current at that time.

When a disconnection fault of a bypass diode is left as it is, there is no problem in a case in which a solar cell connected in parallel to the bypass diode with a disconnection fault generates electric power normally. However, when the solar cell malfunctions or when the solar cell is overshadowed, a current flows generally through the bypass diode but a current flows continuously through the solar cell which malfunctions or is overshadowed when the bypass diode has a disconnection fault. The solar cell which malfunctions or is overshadowed serves as a resistor and thus rises in temperature when a current flows therein, which is dangerous.

CITATION LIST

Patent Literature

Patent Literature 1

Japanese Patent Application Laid-Open (JP-A) No. 2014-011427 (published Jan. 20, 2014)

Patent Literature 2

Japanese Patent Application Laid-Open (JP-A) No. 2014-011428 (published on Jan. 20, 2014)

Patent Literature 3

Japanese Unexamined Patent Application Publication No. 2012-238716 (published on Dec. 6, 2012)

SUMMARY OF INVENTION

Technical Problem

According to the techniques described in Patent Literatures 1 to 3, when a bypass diode of a solar cell module included in a solar cell string has a disconnection fault, it can be detected that a bypass diode of a certain solar cell module has a disconnection fault.

However, according to any of the patent literatures, when a bypass diode of a solar cell module included in a solar cell string has a disconnection fault, the bypass diode with a disconnection fault cannot be identified.

Accordingly, an object of the invention is to provide a test device that identifies a bypass diode with a disconnection fault when a bypass diode of a solar cell module of a solar cell string has a disconnection fault.

Solution to Problem

In order to achieve the above-mentioned object, the invention provides a test device that tests a solar cell string in which a plurality of solar cell modules in which a bypass diode is connected in parallel to one or more solar cells are connected in series when the solar cell string does not generate electric power, the test device including: an application part configured to apply a disconnection position identification signal which is an electrical signal including an AC component to between a positive electrode and a negative electrode of the solar cell string; and a disconnection position identifying part configured to identify a bypass diode with a disconnection fault on the basis of at least one of an AC component of a voltage generated between a frame ground and the positive electrode of the solar cell string and an AC component of a voltage generated between the frame ground and the negative electrode by application of the disconnection position identification signal.

Advantageous Effects of Invention

According to the configuration of the invention, it is possible to identify a bypass diode with a disconnection fault when a bypass diode of a solar cell module of a solar cell string has a disconnection fault.

BRIEF DESCRIPTION OF THE DRAWINGS

FIG. 5b is a graph illustrating an I-V curve of the solar cell string in the cases illustrated in FIG. 5a.

DESCRIPTION OF PREFERRED EMBODIMENTS

First Embodiment

An embodiment of the invention will be described below with reference to the accompanying drawings. A test device according to this embodiment identifies a position of a bypass diode with a disconnection fault in a solar cell string. In this operation, the test device according to this embodiment identifies a solar cell module including the bypass diode with a disconnection fault. Identification of the bypass diode with a disconnection fault includes detecting that "an n-th bypass diode (where n is a natural number) in a solar cell string has a disconnection fault," and various identification methods such as identifying the bypass diode with a disconnection fault in units of solar cell modules such as determining that "a bypass diode with a disconnection fault is present in an n-th solar cell module (where n is a natural number) from a positive electrode of the solar cell string."

Figure 1:
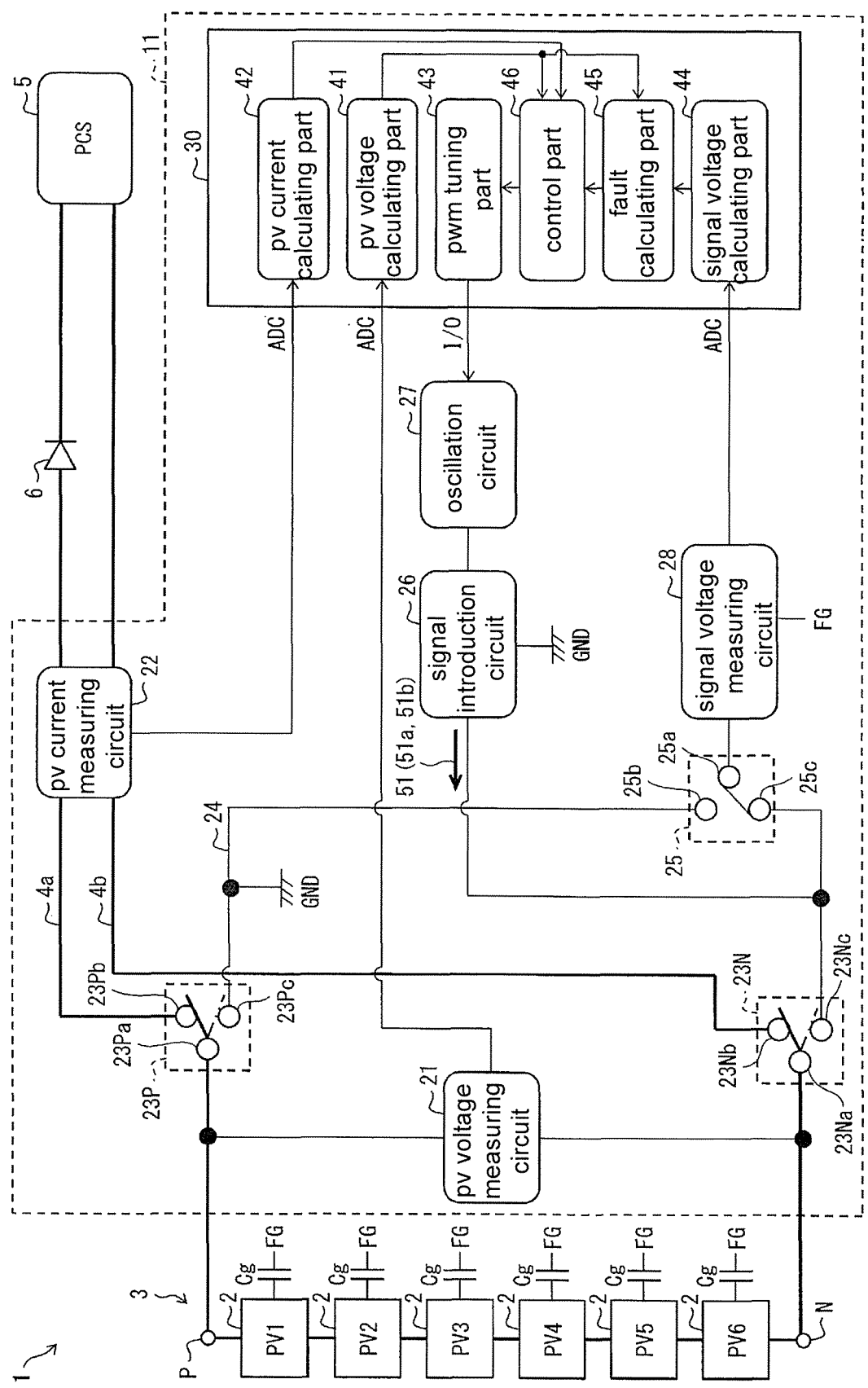
FIG. 1 is a block diagram illustrating a configuration of a photovoltaic system including a test device according to an embodiment of the invention.

FIG. 1 is a block diagram illustrating a configuration of a photovoltaic system 1 including a test device 11 according to an embodiment of the invention. In the drawings which will be described below, FG represents a frame ground, and GND represents a ground (GND) of the test device 11.

Configuration of Photovoltaic System 1

As illustrated in FIG. 1, the photovoltaic system 1 includes a solar cell string 3 in which a plurality of solar cell modules 2 are connected in series. Each solar cell module 2 includes a plurality of solar cells which are connected in series and is formed in a panel shape. Electric power generated from the solar cell string 3 is supplied to a power conditioning system (PCS) 5 via power supply lines 4a and 4b which are power lines. For example, a backflow-prevention diode 6 is disposed in the power supply line 4a. In FIG. 1, for example, the solar cell string 3 includes six solar cell modules 2 which are connected in series. A ground capacitor Cg is formed between each solar cell module 2 and a frame ground FG.

Configuration of Test Device 11

The test device 11 tests whether a bypass diode with a disconnection fault is present in the solar cell modules 2 included in the solar cell string 3, and identifies the solar cell module 2 having a bypass diode with a disconnection fault when a bypass diode has a disconnection fault. This test is performed, for example, every day or at predetermined intervals.

Accordingly, the test device 11 includes a PV voltage measuring circuit 21, a PV current measuring circuit 22, switching relays 23P and 23N, a test power supply line 24, a switching relay 25, a signal introduction circuit 26, an oscillation circuit 27, a signal voltage measuring circuit 28, and a calculation controller 30.

PV Voltage Measuring Circuit 21 and PV Current Measuring Circuit 22

The PV voltage measuring circuit 21 measures a voltage between P and N terminals of the solar cell string 3, that is, an output voltage of the solar cell string 3. Here, an "output voltage" includes a DC component or an AC component of a voltage of the solar cell string 3. Here, an AC component has only to be a value associated with a voltage amplitude such as an effective value or a peak-to-peak value. The measurement result is input to the calculation controller 30. The PV current measuring circuit 22 is disposed in the power supply lines 4a and 4b and measures a current flowing in the power supply lines 4a and 4b, that is, an output current of the solar cell string 3. The measurement result is input to the calculation controller 30.

Switching Relays 23P and 23N

The switching relays 23P and 23N are disposed in the power supply lines 4a and 4b and switch a supply path of electric power output from the solar cell string 3 between the PCS 5 side and the test power supply line 24 side. Specifically, a movable contact 23Pa of the switching relay 23P is connected to a P terminal of the solar cell string 3, a fixed contact 23Pb is connected to the PCS 5 via the PV current measuring circuit 22, and a fixed contact 23Pc is connected to the test power supply line 24. Similarly, a movable contact 23Na of the switching relay 23N is connected to an N terminal of the solar cell string 3, a fixed contact 23Nb is connected to the PCS 5 via the PV current measuring circuit 22, and a fixed contact 23Nc is connected to the test power supply line 24.

Switching Relay 25

The switching relay 25 is disposed in the test power supply line 24 and switches connection of an input terminal of the signal voltage measuring circuit 28 between the P terminal side and the N terminal side of the solar cell string 3. Specifically, a movable contact 25a of the switching relay 25 is connected to the input terminal of the signal voltage measuring circuit 28, a fixed contact 25b is connected to the fixed contact 23Pc of the switching relay 23P via the test power supply line 24, and a fixed contact 25c is connected to the fixed contact 23Nc of the switching relay 23N via the test power supply line 24. The test power supply line 24 is connected to the ground (GND) of the test device 11 between the switching relay 25 and the switching relay 23P.

Oscillation Circuit 27 and Signal Introduction Circuit 26

The oscillation circuit 27 oscillates a signal which is used for the signal introduction circuit (application part) 26 and supplies the oscillated signal to the signal introduction circuit 26. The signal introduction circuit 26 generates a test signal 51 (see FIG. 1) which is introduced into the solar cell string 3 on the basis of the signal supplied from the oscillation circuit 27 and the like and supplies the generated test signal 51 to the N terminal of the solar cell string 3 via the switching relay 23N. The test signal 51 may be supplied to the P terminal of the solar cell string 3 via the switching relay 23P. In this case, the test power supply line 24 is connected to the ground (GND) of the test device 11 between the switching relay 25 and the switching relay 23N.

Test Signal 51

The test signal 51 includes a disconnection test signal 51a for detecting whether disconnection of a bypass diodes has occurred in the solar cell modules 2 of the solar cell string 3 (see FIG. 1) and a disconnection position identification signal 51b (see FIG. 1) for identifying the solar cell module 2 when disconnection of a bypass diode occurs. In this embodiment, a signal of a DC (a DC current) is used for the disconnection test signal 51a, and a signal in which an AC (an AC voltage) is superimposed on a DC (a DC current) is used for the disconnection position identification signal 51b.

Figures 3A, 3B, 3C:
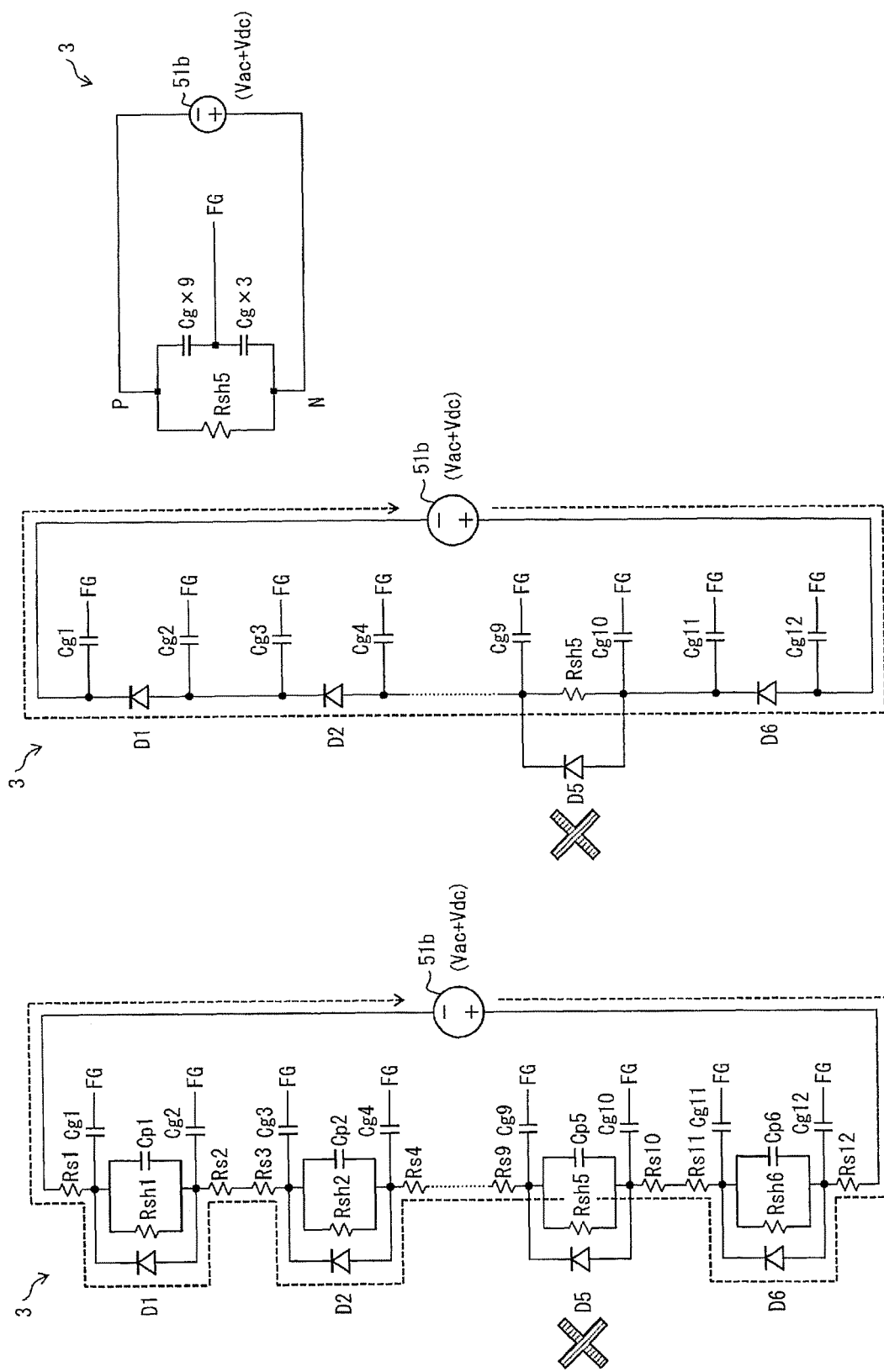
FIG. 3a is an equivalent circuit diagram of the solar cell string illustrated in FIG. 2.
FIG. 3b is an equivalent circuit diagram which is obtained by simplifying the equivalent circuit illustrated in FIG. 3a, and FIG. 3c is an equivalent circuit diagram which is obtained by further simplifying the equivalent circuit illustrated in FIG. 3b.

The AC component included in the disconnection position identification signal 51b is preferably a sinusoidal wave, but is not limited thereto and may be any AC component. The frequency of the AC component of the disconnection position identification signal 51b can range from 1 Hz to 10 kHz and is preferably a low frequency in this range. This is because in description below with reference to FIGS. 3a to 3c, when the AC component of the disconnection position identification signal 51b has a high frequency, an impedance of a capacitance component decreases and the disconnection position identification signal 51b passes through Cp5, not Rsh5. As a result, simplification from FIG. 3a to FIG. 3b is not established and an error in position identification of a bypass diode with a disconnection fault becomes large. The disconnection position identification signal 51b is preferably a signal in which an AC (an AC voltage) is superimposed on a DC (a DC voltage) in terms of identification accuracy of a solar cell module 2 having a bypass diode with a disconnection fault, but may be a signal including only an AC.

Signal Voltage Measuring Circuit 28

When there is a solar cell module 2 having a bypass diode with a disconnection fault, the signal voltage measuring circuit 28 measures AC components (Vn-fg and Vfg-p) of voltages between the frame ground FG of the solar cell module 2 having the bypass diode with a disconnection fault and the P and N terminals of the solar cell string 3 with switching of the switching relay 25.

At this time, it is preferable that the signal voltage measuring circuit 28 include a low-pass filter or a band-pass filter and a noise component be removed from the voltage measured by the signal voltage measuring circuit 28. The voltage measured by the signal voltage measuring circuit 28 is input to the calculation controller 30.

Calculation Controller 30

The calculation controller 30 is constituted by a microcomputer including a CPU, and includes a PV voltage calculating part 41, a PV current calculating part 42, a PWM tuning part 43, a signal voltage calculating part 44, a default calculating part (a disconnection position identifying part and a disconnection default determining part) 45, and a control part (a power generation state determining part) 46.

The PV voltage calculating part 41 converts an output voltage of the solar cell string 3 which is measured by the PV voltage measuring circuit 21 into data which is suitable for processing in the control part 46. The PV current calculating part 42 converts an output current of the solar cell string 3 which is measured by the PV current measuring circuit 22 into data which is suitable for processing in the control part 46.

The PWM tuning part 43 controls the oscillation circuit 27 and tunes a frequency of a signal oscillated by the oscillation circuit 27 to a frequency which is suitable for the test signal 51.

The signal voltage calculating part 44 converts a voltage which is measured by the signal voltage measuring circuit 28 into data which is suitable for processing in the default calculating part 45.

The default calculating part 45 detects whether there is a solar cell module 2 having a bypass diode with a disconnection fault in the solar cell string 3 on the basis of data supplied from the signal voltage calculating part 44 and the PV voltage calculating part 41 at the time of testing the solar cell string 3 using the test device 11. When there is a solar cell module 2 having a bypass diode with a disconnection fault, the default calculating part 45 identifies the solar cell module 2. The default calculating part 45 outputs the identification result to the control part 46.

The control part 46 controls switching of the switching relays 23P and 23N and the switching relay 25. Specifically, when electric power generated by the solar cell string 3 is supplied to the PCS 5, the switching relays 23P and 23N are switched such that the solar cell string 3 is connected to the power supply lines 4a and 4b. On the other hand, when the solar cell string 3 is tested using the test device 11 in a power non-generating state of the solar cell string 3, the switching relays 23P and 23N are switched such that the solar cell string 3 is connected to the test power supply line 24.

The control part 46 determines whether the solar cell string 3 is in a power non-generating state (for example, whether it is night) on the basis of data indicating the output voltage of the solar cell string 3 which is supplied from the PV voltage calculating part 41 and data indicating the output current of the solar cell string 3 which is supplied from the PV current calculating part 42.

Figure 2:
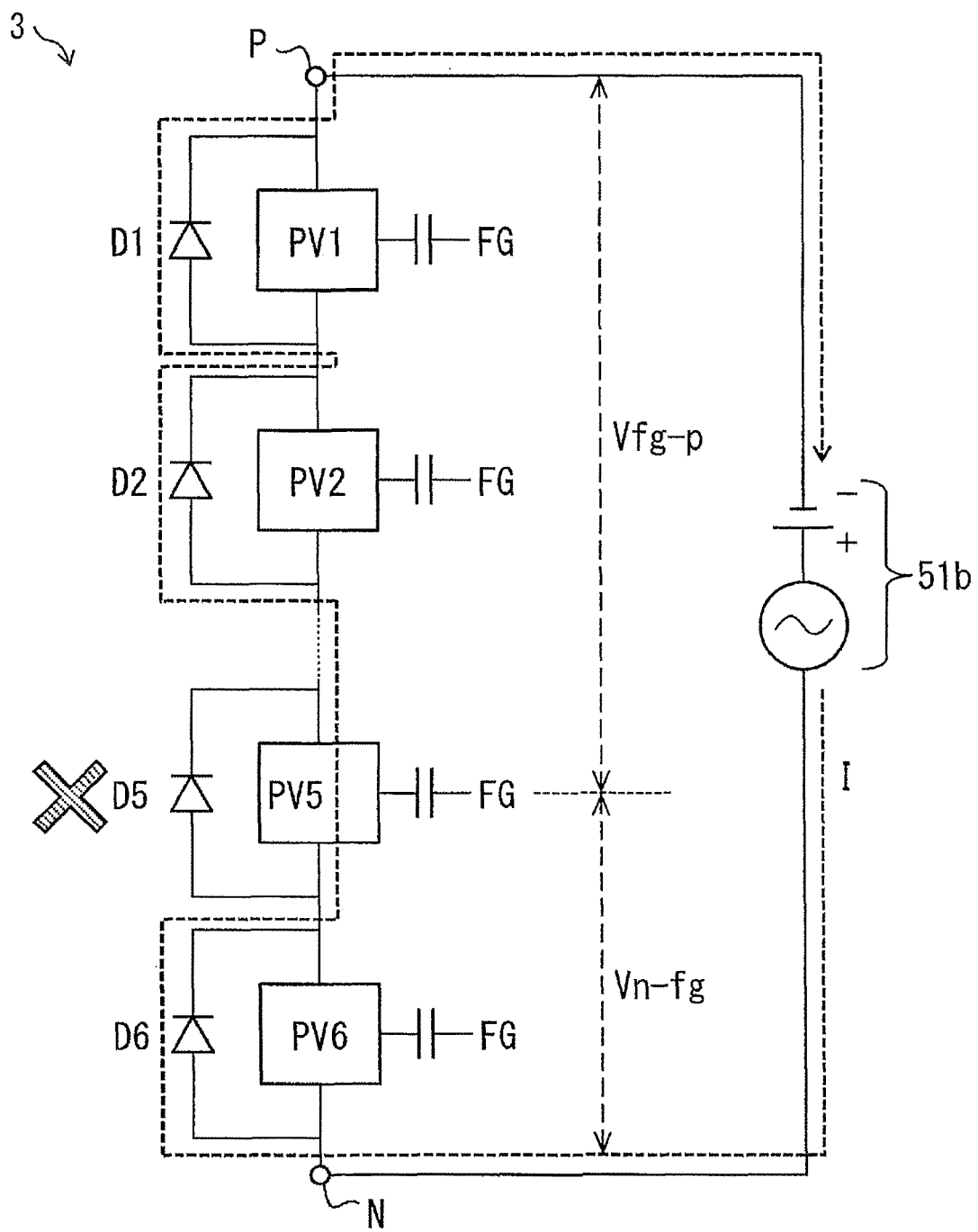
FIG. 2 is a circuit diagram schematically illustrating a state in which a bypass diode of a fifth solar cell module from a P terminal side in a solar cell string illustrated in FIG. 1 has a disconnection fault.

Principle of Identification of Solar Cell Module 2 Having Bypass Diode with a Disconnection Fault The principle by which a solar cell module 2 having a bypass diode with a disconnection fault is identified using the test device 11 will be described below. FIG. 2 is a circuit diagram schematically illustrating a state in which a bypass diode D5 of the fifth solar cell module 2 (PV5, which is marked with x) from the P terminal side in the solar cell string 3 illustrated in FIG. 1 has a disconnection fault.

In identification of the solar cell module 2 having a bypass diode with a disconnection fault, the disconnection position identification signal 51b is applied to between the P and N terminals of the solar cell string 3 when the solar cell string 3 is in a power non-generating state (for example, in the nighttime).

FIG. 2 illustrates AC components of voltages of elements when a voltage is applied forward in a case in which the disconnection position identification signal 51b is applied to between the P and N terminals of the solar cell string 3 when the solar cell string 3 is in the power non-generating state (for example, in the nighttime). In FIG. 2, Vn-fg denotes an AC component of a voltage between the N terminal of the solar cell string 3 and the frame ground FG of the solar cell module 2 (PV5) having the bypass diode D5 with a disconnection fault when the disconnection position identification signal 51b is applied to between the P and N terminals of the solar cell string 3. The AC component has only to be a value associated with voltage amplitude such as an effective value or a peak-to-peak value. Vfg-p is an AC component of a voltage between the frame ground FG of the solar cell module 2 (PV5) and the P terminal of the solar cell string 3. This also has only to be a value associated with voltage amplitude such as an effective value or a peak-to-peak value, similarly to Vfg-p.

FIG. 3a is an equivalent circuit diagram of the solar cell string 3 illustrated in FIG. 2, FIG. 3b is an equivalent circuit diagram which is obtained by simplifying the equivalent circuit illustrated in FIG. 3a, and FIG. 3c is an equivalent circuit diagram which is obtained by further simplifying the equivalent circuit illustrated in FIG. 3b. In FIG. 3a, Rs is a series resistance component of a solar cell module 2. Rsh is a parallel resistance component of the solar cell module 2. Cp is a capacitance component of the solar cell module, that is, a junction capacitor at a pn junction. Cg is a parasitic capacitance component between the solar cell module 2 and the ground, that is, a ground capacitor of the solar cell module 2. It is assumed that each solar cell module 2 has two ground capacitors Cg.

The equivalent circuit of the solar cell string 3 illustrated in FIG. 3a can be simplified into the equivalent circuit illustrated in FIG. 3b by ignoring the series resistance component Rs and the capacitance component Cp of the solar cell modules 2 and the parallel resistance component Rsh of the solar cell modules 2 having the bypass diode D without a disconnection fault. The series resistance component Rs can be ignored because the resistance value thereof is very small and thus the series resistance components can be considered to be short-circuited. The capacitance component Cp can be ignored because impedance thereof is higher than that of the parallel resistance component Rsh, an influence on the voltage applied to the solar cell module 2 having the bypass diode D5 with a disconnection fault is small, and thus the solar cell module can be considered to be open. The parallel resistance component Rsh and the capacitance component Cp of the solar cell modules 2 having a bypass diode D without a disconnection fault can be ignored because most of the current flowing in the solar cell module 2 flows through the bypass diode D and does not flow through the parallel resistance component Rsh, and thus the solar cell module can be considered to be open.

Figure 9:
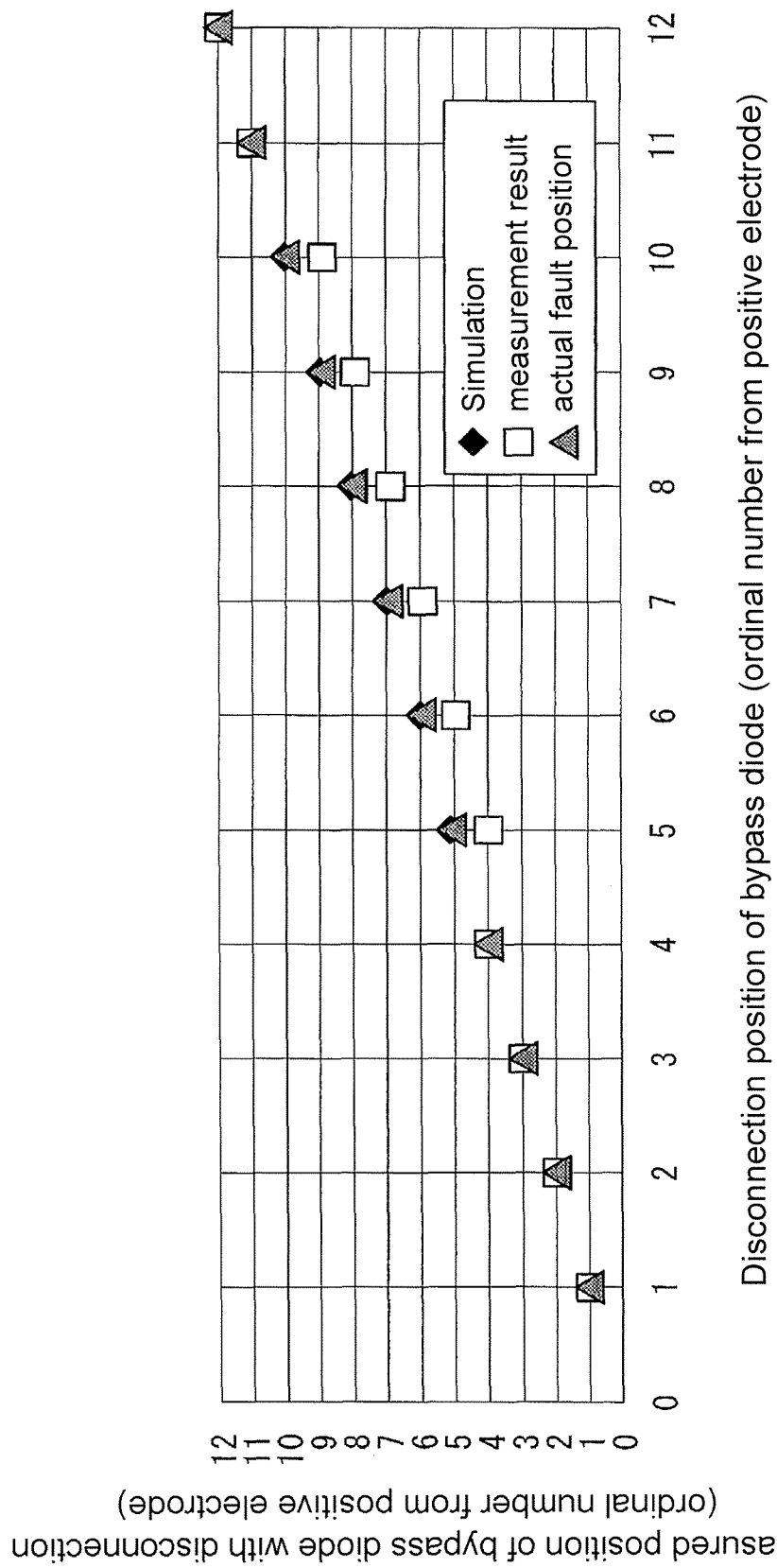
FIG. 9 is a graph illustrating results of measuring a disconnection position of a bypass diode using the test device according to the embodiment of the invention.

In the equivalent circuit illustrated in FIG. 3b, the bypass diode D can be considered to be almost short-circuited when a forward voltage Vf thereof is low and a voltage is applied forward. The ground capacitors Cg are connected in parallel and thus can be added on the P terminal side and the N terminal side with respect to the frame ground FG of the solar cell module 2 having the bypass diode D5 with a disconnection fault. Accordingly, the equivalent circuit of the solar cell string 3 illustrated in FIG. 3b can be simplified to the equivalent circuit illustrated in FIG. 3c. It can be seen that the simplification from FIG. 3b to FIG. 3c is satisfied not to give a large error to position identification even in a state in which a forward voltage Vf is not applied to the bypass diode D. For example, when a voltage applied to a bypass diode D without a disconnection fault is 0.17 V, that is, when the diode cannot be said to be turned on, identification of position may be performed not to actually give a large error as illustrated in FIG. 9.

As described above, the equivalent circuit of the solar cell string 3 can be expressed using only the ground capacitor Cg (CgP) on the P terminal side and the ground capacitor Cg (CgN) on the N terminal side which are connected in series and the parallel resistance component Rsh5 connected in parallel to the ground capacitors Cg (CgP) and Cg (CgN), which are added with respect to the frame ground FG. In the drawings, (Vac+Vdc) added to the disconnection position identification signal 51b denotes that the disconnection position identification signal 51b is a signal in which an AC voltage is superimposed on a DC voltage.

Figure 4A:
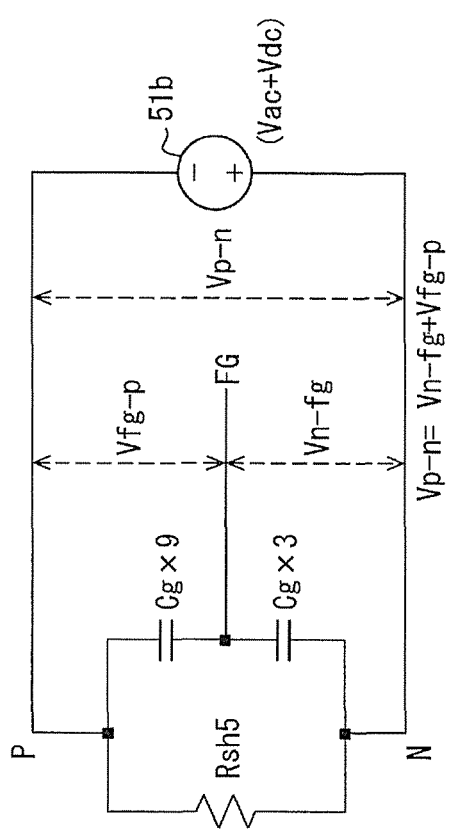
FIG. 4a is a circuit diagram illustrating a voltage relationship between elements in the equivalent circuit illustrated in FIG. 3c
Figure 4B:
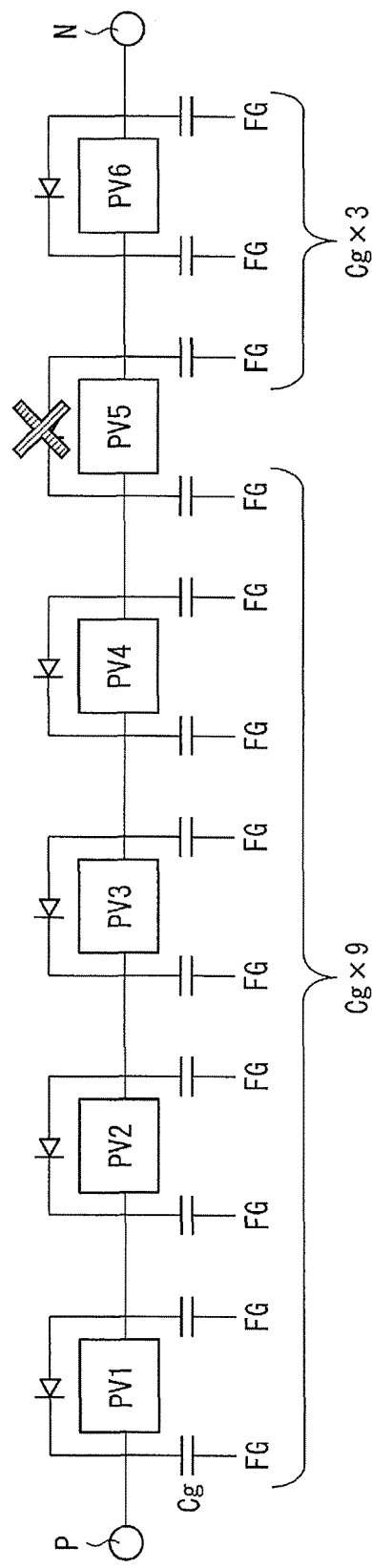
FIG. 4b is a diagram illustrating details of a relationship between a ground capacitor on a P-terminal side with respect to the solar cell module having a bypass diode with a disconnection fault and a ground capacitor on an N-terminal side in the solar cell string illustrated in FIG. 1.

FIG. 4a is a circuit diagram illustrating a voltage relationship of elements in the equivalent circuit illustrated in FIG. 3c. FIG. 4b is a diagram illustrating details of a relationship between the ground capacitor Cg (CgP) on the P terminal side of the solar cell string 3 and the ground capacitor Cg (CgN) on the N-terminal side with respect to the solar cell module 2 having a bypass diode with a disconnection fault.

As illustrated in FIG. 4a, an AC component Vp-n of a voltage between the P and N terminals of the solar cell string 3 is expressed by Vp-n=Vn-fg+Vfg-p. The AC component has only to be a value associated with voltage amplitude such as an effective value or a peak-to-peak value.

As illustrated in FIG. 4a, when the bypass diode of the fifth solar cell module 2 (PV5) from the P terminal side is subjected to a disconnection default, a ratio of the ground capacitor Cg (CgP) on the P terminal side to the ground capacitor Cg (CgN) on the N terminal side with respect to the frame ground FG is CgP:CgN=9:3=4.5-th:1.5-th. The fifth solar cell module 2 from the P terminal is the solar cell module 2 having a bypass diode with a disconnection fault. In this case, when the AC component of the disconnection position identification signal 51b is, for example, 12 V, the ratio of Vfg-p and Vn-fg is a reciprocal of the ratio of CgP and CgN and thus Vfg-p:Vn-fg=3 V:9 V is obtained. Accordingly, when the ratio of Vfg-p and Vn-fg is obtained, the bypass diode with a disconnection fault, that is, the solar cell module 2 having a bypass diode with a disconnection fault, can be identified.

Vp-n corresponds to an AC component of the voltage of the disconnection position identification signal 51*b* and thus may be considered as an existing voltage in advance. In this case, the ratio of Vfg-p and Vn-fg can be acquired by measuring one of Vfg-p and Vn-fg.

Figure 5B:
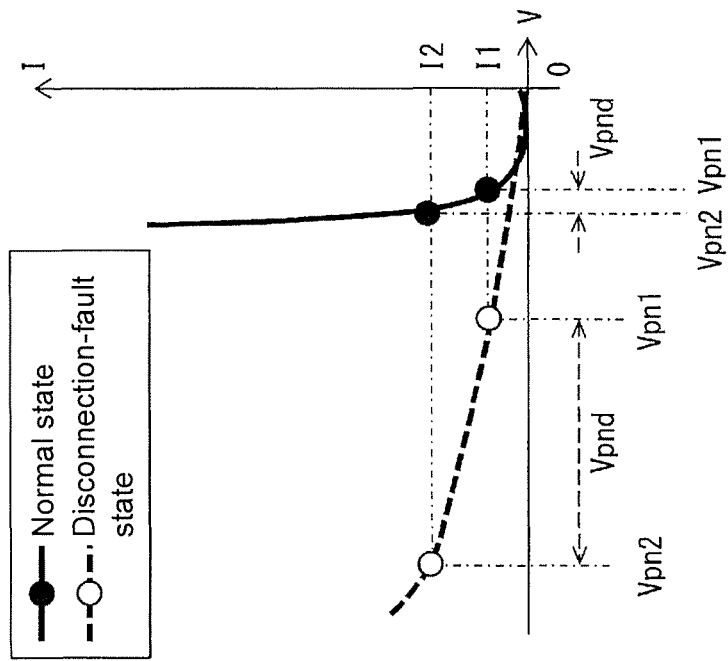
Figure 5A:
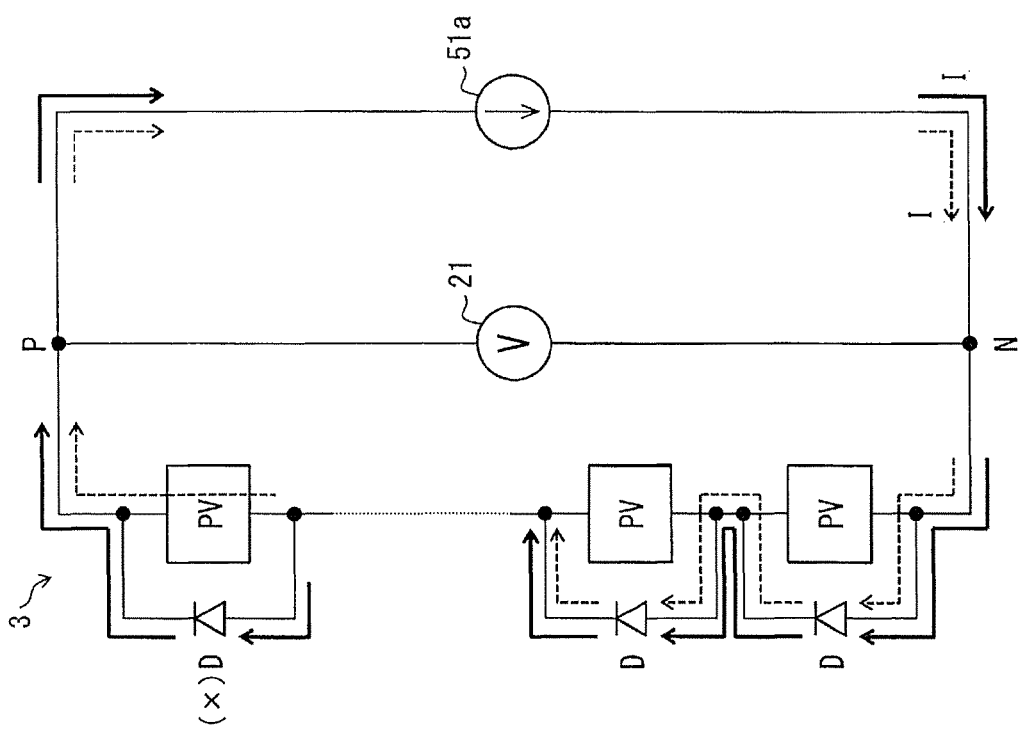
FIG. 5a is a circuit diagram schematically illustrating a flow of a current in a power non-generating state of the solar cell string in a case in which no bypass diode of all solar cell modules has a disconnection fault and a case in which a bypass diode of one solar cell module has a disconnection fault.

Principle of Identification of Whether There is Solar Cell Module 2 Having Bypass Diode with Disconnection Fault When a DC current is introduced from the signal introduction circuit 26 to the solar cell string 3 in a power non-generating state of the solar cell string 3 (for example, in the nighttime), a current flowing in the solar cell string 3 is the same as illustrated in FIG. 5*a*. That is, when no solar cell module 2 has a bypass diode D with a disconnection fault (hereinafter referred to as a normal state), the current I flows through only the bypass diode D as indicated by a solid line. Accordingly, an I-V curve in a normal state is indicated by a solid line in FIG. 5*b*.

On the other hand, when a bypass diode of one solar cell module 2 has a disconnection fault (for example, when the bypass diode D of the solar cell module 2 closest to the P terminal (the bypass diode D marked with (x) in FIG. 5*a*) has a disconnection fault (hereinafter referred to as a disconnection-fault state)), the current I flows as indicated by a dotted line. Specifically, the current I flows through a bypass diode D in a solar cell module 2 having the bypass diode D without a disconnection fault and flows through the solar cells in a solar cell module 2 having a bypass diode with a disconnection fault. Accordingly, in an I-V curve in a disconnection fault state, an increasing curve of a current from the forward voltage Vf is slower than the I-V curve in the normal state as indicated by a dotted line in FIG. 5*b*.

Accordingly, as illustrated in FIG. 5*b*, a voltage Vpnd (|Vpn2|−|Vpn1|) which is a difference between the DC voltage |Vpn1| between the P and N terminals of the solar cell string 3 when a first DC current I1 is introduced and the DC voltage |Vpn2| between the P and N terminals of the solar cell string 3 when a second DC current I2 (I2>I1) is introduced decreases in the normal state and increases in the disconnection-fault state. Therefore, by setting a threshold value Vpnth on the basis of the voltage Vpnd in the normal state and the voltage Vpnd in the disconnection-fault state (for example, setting the threshold value Vpnth to a voltage between the voltage Vpnd in the normal state and the voltage Vpnd in the disconnection-fault state) and comparing the voltage Vpnd at the time of test with the threshold value Vpnth, it is possible to detect whether a solar cell module 2 has a disconnection fault.

In this embodiment, the threshold value Vpnth is set to the forward voltage Vf of the bypass diode.

Whether there is a solar cell module 2 having a bypass diode D with a disconnection fault can be detected, for example, using the method described above as an example, but may be detected, for example, using the methods described in Patent Literatures 1 to 3.

Determination of a power non-generating state of the solar cell string 3, for example, the nighttime, is performed as follows using the DC voltage between the P and N terminals or the output current of the solar cell string 3.

(1) The DC voltage between the P and N terminals of the solar cell string 3 is measured and it is determined whether a state in which the DC voltage between the P and N terminals is equal to or less than a predetermined value is maintained for a predetermined time or more.

(2) When it is determined in (1) that the state in which the DC voltage between the P and N terminals is equal to or less than the predetermined time or more, the output current of the solar cell string 3 is measured and it is determined that it is night when the output current is equal to or less than a predetermined value. In this embodiment, the output current is measured by the PV current measuring circuit.

Operation of Test Device 11

The operation of detecting whether there is a solar cell module 2 having a bypass diode with a disconnection fault and the operation of identifying the solar cell module 2 having a bypass diode with a disconnection fault which are performed by the test device 11 with the above-mentioned configuration will be described below.

Figure 6:
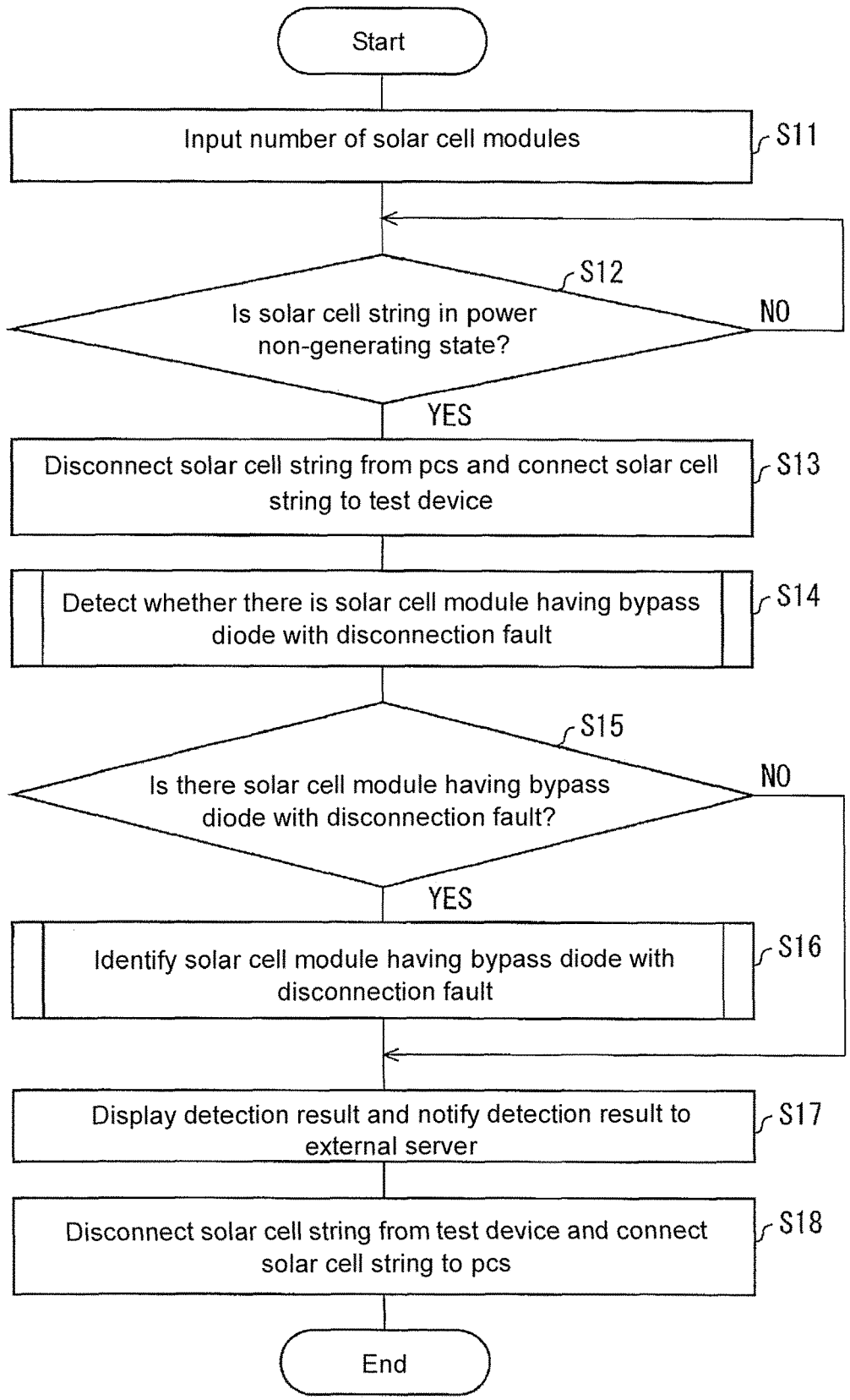
FIG. 6 is a flowchart schematically illustrating an operation of testing the solar cell string using the test device illustrated in FIG. 1.
Figure 7:
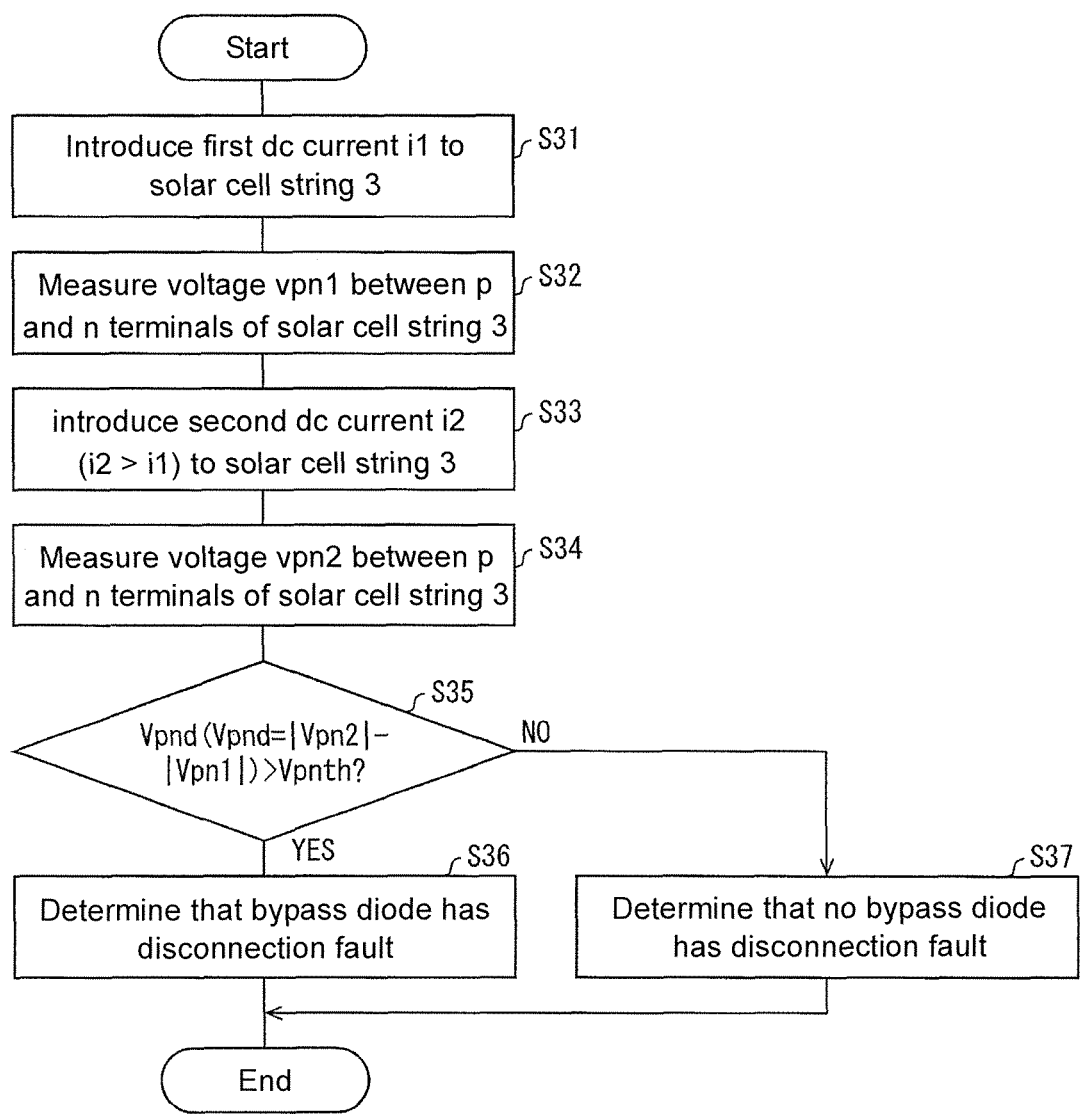
FIG. 7 is a flowchart illustrating an operation of detecting whether there is a solar cell module having a bypass diode with a disconnection fault using the test device illustrated in FIG. 1.
Figure 8:
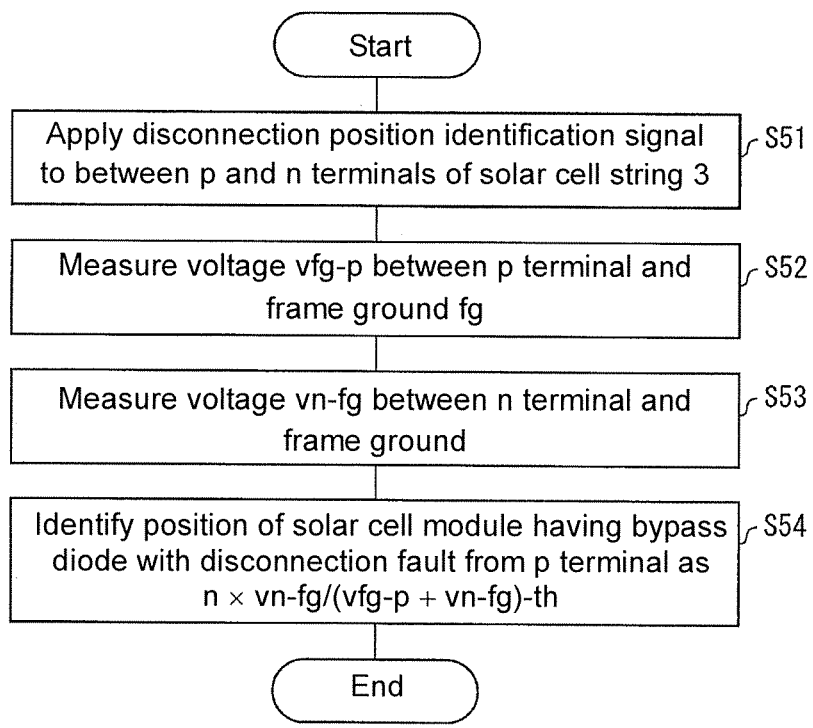
FIG. 8 is a flowchart illustrating an operation of identifying a solar cell module having a bypass diode with a disconnection fault using the test device illustrated in FIG. 1.

FIG. 6 is a flowchart schematically illustrating an operation of testing the solar cell string 3 which is performed by the test device 11. FIG. 7 is a flowchart illustrating an operation of detecting whether there is a solar cell module 2 having a bypass diode with a disconnection fault. FIG. 8 is a flowchart illustrating an operation of identifying a solar cell module 2 having a bypass diode with a disconnection fault.

As illustrated in FIG. 6, in test of the solar cell string 3 by the test device 11, first, an operator inputs the number of solar cell modules 2 included in the solar cell string 3 which is a test target to the test device 11 (S11). Accordingly, the test device 11 includes an input operation part (for example, an input key or a keyboard) that receives an input operation. Alternatively, the test device is configured to be connected to an input operation part (for example, a keyboard).

Then, the control part 46 determines whether the solar cell string 3 is in a power non-generating state (whether it is night) on the basis of the DC voltage between the P and N terminals of the solar cell string 3 which is input via the PV voltage measuring circuit 21 and the PV voltage calculating part 41 and the output current of the solar cell string 3 which is input via the PV current measuring circuit 22 and the PV current calculating part 42 (S12).

When it is determined in S12 that the solar cell string 3 is in the power non-generating state, the switching relays 23P and 23N are switched such that the solar cell string 3 which is a detection target is switched from a state (the state illustrated in FIG. 1) in which the solar cell string is connected to the PCS 5 to a state in which the solar cell string is connected to the test power supply line 24, that is, the test device 11 (where the solar cell string 3 is disconnected from the PCS 5 and is connected to the test device 11) (S13). The state in which the switching relays 23P and 23N have been switched is indicated by a two-dash chain line in FIG. 1.

When the test device 11 is not a permanent device (a stationary type device) but is a portable device which can be carried by an operator, the determination operation of S12 is performed through determination by an operator and thus may not be necessary.

Then, an operation of detecting whether there is a solar cell module 2 having a bypass diode with a disconnection fault is performed (S14). When it is determined in S14 that there is solar cell module 2 having a bypass diode with a disconnection fault (S15), an operation of identifying the solar cell module 2 having a bypass diode with a disconnection fault is performed (S16). Thereafter, S17 is performed. On the other hand, when it is determined in S14 that there is no solar cell module 2 having a bypass diode with a disconnection fault, S17 is performed.

When there is a solar cell module 2 having a bypass diode with a disconnection fault, the control part 46 displays an identification result of the solar cell module 2 on a display part (not illustrated) of the test device 11 and notifies the identification result to an external server in S17. On the other hand, when there is no solar cell module 2 having a bypass diode with a disconnection fault, the purport is displayed on the display and is notified to the external server.

Thereafter, the control part 46 switches the switching relays 23P and 23N such that the solar cell string 3 as a detection target is switched to a state in which the solar cell string is connected to the PCS 5 (the state illustrated in FIG. 1 in which the solar cell string 3 is disconnected from the test device 11 and is connected to the PCS 5) (S18), and ends the operation. The state in which the switching relays 23P and 23N have switched is indicated by the solid lien in FIG. 1.

Operation of Detecting Whether There is Solar Cell Module 2 Having Bypass Diode with Disconnection Fault The operation of determining whether there is a solar cell module 2 having a bypass diode with a disconnection fault which is illustrated in S14 of FIG. 6 will be described below.

In this determination operation, as illustrated in FIG. 7, the first DC current I1 as the disconnection test signal 51a is introduced into the solar cell string 3 from the signal introduction circuit 26 (S31) and the DC voltage Vpn1 between the P and N terminals of the solar cell string 3 is measured by the PV voltage measuring circuit 21 (S32). The DC voltage Vpn1 measured by the PV voltage measuring circuit 21 is input to the default calculating part 45 via the PV voltage calculating part 41.

Then, the second DC current I2 (I2>I1) as the disconnection test signal 51a is introduced into the solar cell string 3 from the signal introduction circuit 26 (S33) and the DC voltage Vpn2 between the P and N terminals of the solar cell string 3 is measured by the PV voltage measuring circuit 21 (S34). Similarly, the DC voltage Vpn2 measured by the PV voltage measuring circuit 21 is input to the default calculating part 45 via the PV voltage calculating part 41.

Then, the default calculating part 45 calculates a voltage Vpnd (Vpnd=|Vpn2|−|Vpn1|) from the DC voltage |Vpn1| and the DC voltage |Vpn2|, and compares the voltage Vpnd with a preset threshold value Vpnth (S35).

As a result, when the voltage Vpnd is greater than the threshold value Vpnth, the default calculating part 45 determines that there is a solar cell module 2 having a bypass diode with a disconnection fault in the solar cell string 3, that is, a bypass diode has a disconnection fault (S36). On the other hand, when the voltage Vpnd is equal to or less than the threshold value Vpnth, the default calculating part 45 determines that there is no solar cell module 2 having a bypass diode with a disconnection fault in the solar cell string 3, that is, no bypass diode has a disconnection fault (S37).

Operation of Identifying Solar Cell Module 2 Having Bypass Diode with Disconnection Fault The operation of identifying a solar cell module 2 having a bypass diode with a disconnection fault which is illustrated in S16 in FIG. 6 will be described below. When it is determined that there is a solar cell module 2 having a bypass diode with a disconnection fault, the default calculating part 45 performs this operation.

In this identification operation, as illustrated in FIG. 8, first, the disconnection position identification signal 51b in which AC is superimposed on DC is applied to between the P and N terminals of the solar cell string 3 from the signal introduction circuit 26 (S51).

The switching relay 25 is switched to the P terminal side of the solar cell string 3 and the AC component Vfg-p of the voltage between the P terminal (the positive electrode) and the frame ground FG is measured by the signal voltage measuring circuit 28 (S52). The switching relay 25 is switched to the N terminal side of the solar cell string 3 and the AC component Vn-fg of the voltage between the N terminal (the negative electrode) and the frame ground FG is measured by the signal voltage measuring circuit 28 (S53).

The AC component Vfg-p of the voltage and the AC component Vn-fg of the voltage which are measured by the signal voltage measuring circuit 28 are input to the default calculating part 45 via the signal voltage calculating part 44 of the calculation controller 30. The order of the operation of S52 and the operation of S53 may be reversed.

Then, the default calculating part 45 identifies the position of the solar cell module 2 having a bypass diode with a disconnection fault from the P terminal (the positive electrode) as N×Vn-fg/(Vfg-p+Vn-fg)-th using the number N of solar cell modules 2 of the solar cell string 3, the AC component Vfg-p of the voltage, and the AC component Vn-fg of the voltage (S54). The result is output to the control part 46.

In the operation illustrated in FIG. 8, both of Vfg-p and Vn-fg are measured to calculate Vfg-p+Vn-fg. However, Vfg-p+Vn-fg is a voltage of the disconnection position identification signal 51b, and both of Vfg-p and Vn-fg do not need to be measured when the voltage of the disconnection position identification signal 51b is known.

As expressed above by the equation, a ratio of Vn-fg to Vfg-p+Vn-fg is used to identify the solar cell module 2 having a bypass diode with a disconnection fault. However, a ratio of Vfg-p to Vfg-p+Vn-fg may be used instead. That is, when the voltage of the disconnection position identification signal 51b is known, only one of Vfg-p and Vn-fg can be measured. The same is true of a test device 11 according to another embodiment.

Simulation Result

A result of measurement of a disconnection position of a bypass diode by the test device 11 will be described below. FIG. 9 is a graph illustrating a result of measurement of a disconnection position of a bypass diode by the test device 11.

In a solar cell string 3 used for the simulation, 12 polycrystalline solar cell modules 2 are connected in series.

In FIG. 9, the horizontal axis represents an actual position of a bypass diode with a disconnection fault (a position (an ordinal number) from the positive electrode of the solar cell string 3) and the vertical axis represents a position of a bypass diode with a disconnection fault measured by the test device 11 (a position (an ordinal number) from the positive electrode of the solar cell string 3). An "actual fault position" denotes an actual position of a bypass diode with a disconnection fault. A "measurement result" denotes a position of a bypass diode with a disconnection fault measured by the test device 11. "Simulation" denotes a position of a bypass diode with a disconnection fault as a result of simulation on the basis of the equivalent circuit of the solar cell string 3.

In the simulation result illustrated in FIG. 9, one measurement error occurs in cases in which fifth to tenth bypass diodes from the positive electrode of the solar cell string 3 have a disconnection fault, but it can be confirmed that a bypass diode with a disconnection fault can be accurately identified by the test device 11, and a solar cell module 2 having a bypass diode with a disconnection fault can be identified with high accuracy.

Advantages of Test Device 11

As described above, in the test device 11 according to this embodiment, the disconnection position identification signal 51b is applied to between the P and N terminals of the solar cell string 3 in which a plurality of solar cell modules in which a bypass diode is connected in parallel to one or more solar cells are connected in series, and a bypass diode with a disconnection fault is identified on the basis of at least one of an AC component of a voltage generated between the frame ground and the positive electrode (the P terminal) of the solar cell string 3 and an AC component of a voltage generated between the frame ground and the negative electrode (the N terminal) as a result. Accordingly, without testing each of the plurality of solar cell modules 2 of the solar cell string 3 by an operator using the test device, an operator going over a roof and testing the solar cell modules 2 of the solar cell string 3 installed on a roof of a house using the test device, or the like, it is possible to easily identify a solar cell module 2 having a bypass diode with a disconnection fault.

Figure 11:
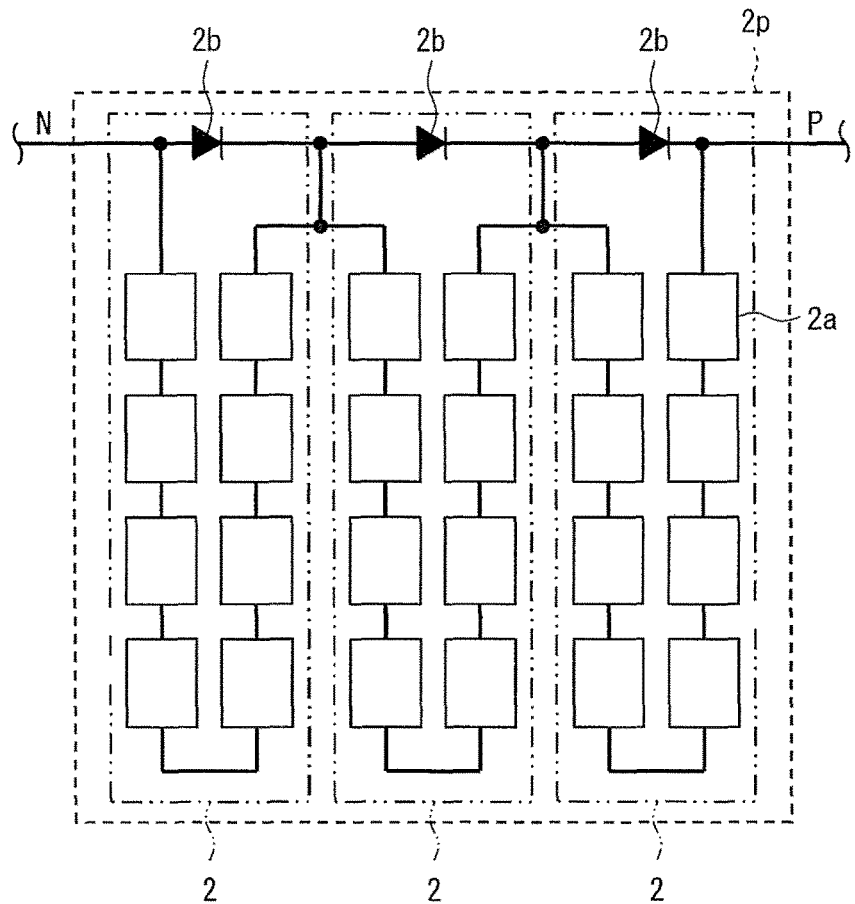
FIG. 11 is a diagram illustrating a relationship of a solar cell panel, a solar cell module, a solar cell, and a bypass diode.

When a solar cell module 2 having a bypass diode with a disconnection fault has been actually identified, it is necessary to replace the solar cell module 2. In this specification, a unit of replacement is referred to as a solar cell panel. An actual solar cell panel cannot be said to match the solar cell module 2. A relationship between the solar cell panel and the solar cell module is illustrated in FIG. 11. As illustrated in FIG. 11, for example, three solar cell modules 2 are connected in series in an actual solar cell panel 2p. Each solar cell module 2 includes a plurality of solar cells 2a. Accordingly, when a bypass diode 2b included in any of the three solar cell modules 2 has a disconnection fault, the solar cell modules 2 not having a disconnection fault in the same solar cell panel 2p are to be replaced.

"Identifying a bypass diode with a disconnection fault" includes an identification method in the unit of a solar cell panel of determining that "a bypass diode with a disconnection fault is present in an n-th solar cell panel (where n is a natural number) from the positive electrode of the solar cell string."

In this embodiment, the test device 11 performs the operation of detecting whether there is a solar cell module 2 having a bypass diode with a disconnection fault (S14) and performs the operation of identifying the solar cell module 2 having a bypass diode with a disconnection fault (S16) when there is the solar cell module 2 having a bypass diode with a disconnection fault (S15) as illustrated in FIG. 6.

However, in S16, the operation of identifying a solar cell module 2 having a bypass diode with a disconnection fault may be performed without performing the operations of S14 and S15. In this case, the operations of S14 and S15 can be removed from the flowchart illustrated in FIG. 6.

Figure 12:
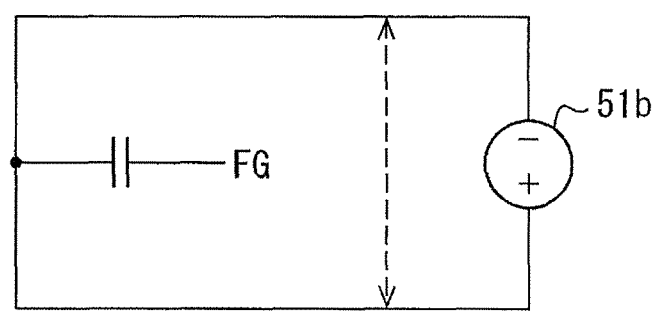
FIG. 12 is an equivalent circuit diagram when a bypass diode of a solar cell module does not have a disconnection fault in the equivalent circuit illustrated in FIG. 3c.

On the other hand, in the configuration in which the operations of S14 and S15 are removed as described above, when a bypass diode of a solar cell module 2 located at the center of the solar cell string 3 has a disconnection fault, the ratio of the AC component Vfg-p of a voltage to the AC component of Vn-fg of a voltage becomes 1:1 through only the operation of S16. When no bypass diode of the solar cell modules 2 has a disconnection fault, the equivalent circuit corresponding to FIG. 3c becomes the same as illustrated in FIG. 12 and the ratio of the AC component Vfg-p of a voltage and the AC component of Vn-fg of a voltage is 1:1. Accordingly, it is not possible to determine whether the bypass diode located at the center of the solar cell string 3 has a disconnection fault or whether the bypass diode does not have a disconnection fault. The solar cell module 2 located at the center of the solar cell string 3 is one solar cell module 2 located at the center in a solar cell string 3 in which the number of solar cell modules 2 is an odd number, and is two solar cell modules 2 located at the center in a solar cell string 3 in which the number of solar cell modules 2 is an even number.

In this case, as illustrated in FIG. 6, the above-mentioned problem can be solved using a configuration in which the operation of S16 is performed after the operations of S14 and S15 are performed. When the ratio of the AC component Vfg-p of a voltage and the AC component of Vn-fg of a voltage is 1:1 in S16, the operations of S14 and S15 may be performed.

Second Embodiment

Another embodiment of the invention will be described below with reference to the drawings. An outline of a test operation of a solar cell string 3 using a test device 11 according to this embodiment is the same as in the flowchart illustrated in FIG. 6. However, an operation illustrated in the flowchart of FIG. 10 is performed instead of the operation illustrated in the flowchart illustrated in FIG. 8 as the operation of identifying a solar cell module 2 having a bypass diode with a disconnection fault.

Figure 10:
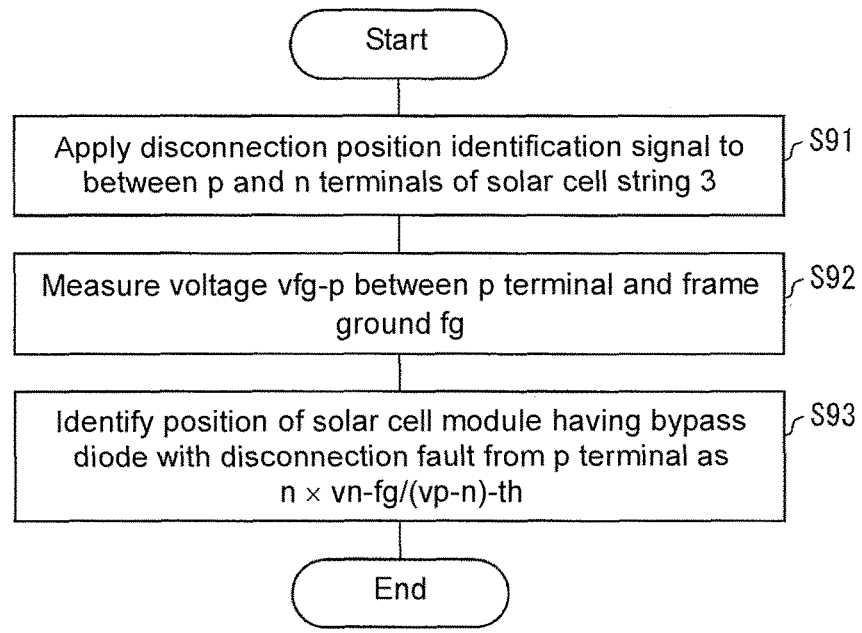
FIG. 10 is a flowchart illustrating an operation of identifying a solar cell module having a bypass diode with a disconnection fault in a test device according to another embodiment of the invention.

Operation of Identifying Solar Cell Module 2 Having Bypass Diode with Disconnection Fault The operations of S91 and S92 illustrated in FIG. 10 are the same as the operations of S51 and S52 illustrated in FIG. 8.

First, a disconnection position identification signal 51b in which an AC is superimposed on a DC is applied to between the P and N terminals (between the positive and negative electrodes) of the solar cell string 3 from the signal introduction circuit 26 (S91).

Then, the switching relay 25 is switched to the P terminal side of the solar cell string 3 and an AC component Vfg-p of a voltage between the P terminal (the positive electrode) and the frame ground FG is measured by the signal voltage measuring circuit 28 (S92).

Then, the default calculating part 45 identifies the position of the solar cell module 2 having a bypass diode with a disconnection fault from the P terminal (the positive electrode) as N×Vn-fg/(Vp-n)-th using the number N of solar cell modules 2 of the solar cell string 3, the AC component Vp-n of the voltage between the P and N terminals of the solar cell string 3 in the normal state, and the AC component Vn-fg (Vn-fg=(Vp-n)−(Vfg-p)) of the voltage (S54). The result is output to the control part 46.

The AC component Vp-n of the voltage between the P and N terminals of the solar cell string 3 in the normal state is a voltage which is measured and stored in advance. Alternatively, the AC component Vp-n of the voltage is an AC component Vp-n in the normal state of another solar cell string 3 having the same number of solar cell modules 2.

In the above example, in S92, the AC component Vfg-p of a voltage is measured and the AC component Vn-fg of a voltage is acquired from the AC component Vfg-p of the measured voltage and the AC component Vp-n of a voltage. However, the switching relay 25 may be switched to the N terminal side of the solar cell string 3 and the AC component Vn-fg of the voltage between the N terminal (the negative electrode) and the frame ground FG may be directly measured by the signal voltage measuring circuit 28.

In this embodiment described above, the test device 11 is assumed to be a permanent device, but can be applied for incorporation into a device or a PCS which can be carried by an operator.

Conclusion

The test device according to the invention is a test device that tests a solar cell string in which a plurality of solar cell modules in which a bypass diode is connected in parallel to one or more solar cells are connected in series when the solar cell string does not generate electric power, the test device including: an application part configured to apply a disconnection position identification signal which is an electrical signal including an AC component to between a positive electrode and a negative electrode of the solar cell string; and a disconnection position identifying part configured to identify a bypass diode with a disconnection fault on the basis of at least one of an AC component of a voltage generated between a frame ground and the positive electrode of the solar cell string and an AC component of a voltage generated between the frame ground and the negative electrode by application of the disconnection position identification signal.

According to this configuration, the application part applies the disconnection position identification signal which is an electrical signal including an AC component to between the positive electrode and the negative electrode of the solar cell string. The disconnection position identifying part identifies a bypass diode with a disconnection fault on the basis of at least one of the AC component of the voltage generated between the frame ground and the positive electrode of the solar cell string and the AC component of the voltage generated between the frame ground and the negative electrode by application of the disconnection position identification signal.

That is, the AC component of the voltage between the frame ground and the positive electrode of the solar cell string and the AC component of the voltage between the frame ground and the negative electrode which are generated by application of the disconnection position identification signal to between the positive electrode and the negative electrode of the solar cell string reflect the position of the bypass diode with a disconnection fault. Accordingly, it is possible to identify the bypass diode with a disconnection fault on the basis of at least one of the AC components which are generated by the disconnection position identification signal.

The test device may further include a power generation state determining part configured to determine whether the solar cell string is in a power non-generating state, and, when the power generation state determining part determines that the solar cell string is in a power non-generating state, the application part may apply the disconnection position identification signal and the disconnection position identifying part may identify a bypass diode with a disconnection fault.

According to this configuration, the power generation state determining part determines whether the solar cell string as a test target is in a power non-generating state. When the disconnection position identification signal is applied to between the positive electrode and the negative electrode of the solar cell string in a state in which the solar cell string is in a power non-generating state and a bypass diode has a disconnection fault, the solar cell string can be expressed by a simple equivalent circuit including, for example, a parallel resistance component of the solar cell module having a bypass diode with a disconnection fault and a ground capacitor for each solar cell module between the bypass diode with a disconnection fault and the positive electrode and the negative electrode of the solar cell string.

Therefore, when the generation state determining part determines that the solar cell string is in a power non-generating state, the disconnection position identifying part can easily identify a bypass diode with a disconnection fault by causing the application part to apply the disconnection position identification signal.

In the test device, the disconnection position identifying part may be configured to identify the bypass diode with a disconnection fault on the basis of a ratio of the AC component of the voltage generated between the frame ground and the positive electrode of the solar cell string or the AC component of the voltage generated between the frame ground and the negative electrode and an AC component of a voltage between the positive electrode and the negative electrode of the solar cell string.

According to this configuration, when a bypass diode of one solar cell module in the solar cell string has a disconnection fault, the position of the bypass diode with a disconnection fault can be expressed as a ratio of the AC component of the voltage generated between the frame ground and the positive electrode of the solar cell string or the AC component of the voltage generated between the frame ground and the negative electrode and an AC component of a voltage between the positive electrode and the negative electrode of the solar cell string. Accordingly, the disconnection position identifying part can identify the bypass diode with a disconnection fault on the basis of the ratio.

In the test device, the disconnection position identifying part may be configured to identify the bypass diode with a disconnection fault on the basis of a ratio of the AC component of the voltage generated between the frame ground and the positive electrode of the solar cell string and the AC component of the voltage generated between the frame ground and the negative electrode.

According to this configuration, the disconnection position identifying part identifies the bypass diode with a disconnection fault on the basis of the ratio of the AC component of the voltage generated between the frame ground and the positive electrode of the solar cell string and the AC component of the voltage generated between the frame ground and the negative electrode.

That is, the AC component of the voltage between the frame ground and the positive electrode of the solar cell string and the AC component of the voltage between the frame ground and the negative electrode which are generated by application of the disconnection position identification signal to between the positive electrode and the negative electrode of the solar cell string reflect the position of the bypass diode with a disconnection fault. Accordingly, to the disconnection position identifying part can identify the bypass diode with a disconnection fault on the basis of the ratio between the AC component of the voltage between the frame ground and the positive electrode of the solar cell string and the AC component of the voltage between the frame ground and the negative electrode which are generated due to application of the disconnection position identification signal.

The test device may further include a disconnection fault determining part configured to determine whether one of the bypass diodes has a disconnection fault, and the disconnection position identifying part may be configured to determine that the bypass diode located at the center has a disconnection fault when the disconnection fault determining part determines that one of the bypass diodes has a disconnection fault and the ratio is 1:1.

According to this configuration, the disconnection fault determining part determines whether one of the bypass diodes has a disconnection fault. The disconnection position identifying part determines that the bypass diode located at the center has a disconnection fault when the disconnection fault determining part determines that one of the bypass diodes has a disconnection fault and the ratio of the AC potential of the positive electrode and the AC potential of the negative electrode to the frame ground potential of the solar cell string is 1:1.

Accordingly, even when a bypass diode at the center of the solar cell string has a disconnection fault, it is possible to appropriately identify the bypass diode with a disconnection fault.

In the test device, the disconnection position identification signal may include a forward DC component of the bypass diode.

According to this configuration, since the disconnection position identification signal includes the forward DC component of the bypass diode, it is possible to perform an operation of identifying a bypass diode with a disconnection fault with higher accuracy than that when the disconnection position identification signal includes only an AC component.

The invention is not limited to the above-mentioned embodiments, but can be modified in various forms within the scope of the appended claims. Embodiments which are obtained by appropriately combining technical means disclosed in the embodiments belong to the technical scope of the invention.

What is claimed is:

1. A test device that tests a solar cell string in which a plurality of solar cell modules in which a bypass diode is connected in parallel to one or more solar cells are connected in series when the solar cell string does not generate electric power, the test device comprising:
an application part configured to apply a disconnection position identification signal which is an electrical signal including an AC component to between a positive electrode and a negative electrode of the solar cell string; and
a disconnection position identifying part configured to identify a bypass diode with a disconnection fault on a basis of at least one of an AC component of a voltage generated between a frame ground and the positive electrode of the solar cell string and an AC component of a voltage generated between the frame ground and the negative electrode by application of the disconnection position identification signal.

2. The test device according to claim 1, further comprising a power generation state determining part configured to determine whether the solar cell string is in a power non-generating state,
wherein, when the power generation state determining part determines that the solar cell string is in the power non-generating state, the application part applies the disconnection position identification signal and the disconnection position identifying part identifies a bypass diode with a disconnection fault.

3. The test device according to claim 1, wherein the disconnection position identifying part identifies the bypass diode with a disconnection fault on a basis of a ratio of the AC component of the voltage generated between the frame ground and the positive electrode of the solar cell string or the AC component of the voltage generated between the frame ground and the negative electrode to an AC component of a voltage between the positive electrode and the negative electrode of the solar cell string.

4. The test device according to claim 1, wherein the disconnection position identifying part identifies the bypass diode with a disconnection fault on a basis of a ratio of the AC component of the voltage generated between the frame ground and the positive electrode of the solar cell string and the AC component of the voltage generated between the frame ground and the negative electrode.

5. The test device according to claim 4, further comprising a disconnection fault determining part configured to determine whether one of the bypass diodes has a disconnection fault,
wherein the disconnection position identifying part determines that the bypass diode located at a center has a disconnection fault when the disconnection fault determining part determines that one of the bypass diodes has a disconnection fault and the ratio is 1:1.

6. The test device according to claim 1, wherein the disconnection position identification signal includes a forward DC component of the bypass diode.

7. The test device according to claim 2, wherein the disconnection position identifying part identifies the bypass diode with a disconnection fault on a basis of a ratio of the AC component of the voltage generated between the frame ground and the positive electrode of the solar cell string or the AC component of the voltage generated between the frame ground and the negative electrode to an AC component of a voltage between the positive electrode and the negative electrode of the solar cell string.

8. The test device according to claim 2, wherein the disconnection position identifying part identifies the bypass diode with a disconnection fault on a basis of a ratio of the AC component of the voltage generated between the frame ground and the positive electrode of the solar cell string and the AC component of the voltage generated between the frame ground and the negative electrode.

9. The test device according to claim 8, further comprising a disconnection fault determining part configured to determine whether one of the bypass diodes has a disconnection fault,
wherein the disconnection position identifying part determines that the bypass diode located at a center has a disconnection fault when the disconnection fault determining part determines that one of the bypass diodes has a disconnection fault and the ratio is 1:1.

10. The test device according to claim 2, wherein the disconnection position identification signal includes a forward DC component of the bypass diode.

11. The test device according to claim 3, wherein the disconnection position identification signal includes a forward DC component of the bypass diode.

12. The test device according to claim 4, wherein the disconnection position identification signal includes a forward DC component of the bypass diode.

13. The test device according to claim 5, wherein the disconnection position identification signal includes a forward DC component of the bypass diode.

14. The test device according to claim 6, wherein the disconnection position identification signal includes a forward DC component of the bypass diode.

15. The test device according to claim 7, wherein the disconnection position identification signal includes a forward DC component of the bypass diode.

16. The test device according to claim 8, wherein the disconnection position identification signal includes a forward DC component of the bypass diode.

17. The test device according to claim 9, wherein the disconnection position identification signal includes a forward DC component of the bypass diode.

* * * * *